United States Patent
Adekore et al.

(10) Patent No.: US 7,829,376 B1
(45) Date of Patent: Nov. 9, 2010

(54) METHODS OF FORMING ZINC OXIDE BASED II-VI COMPOUND SEMICONDUCTOR LAYERS WITH SHALLOW ACCEPTOR CONDUCTIVITIES

(75) Inventors: Bunmi T. Adekore, Medford, MA (US); Jonathan M. Pierce, Raleigh, NC (US); Robert F. Davis, Pittsburgh, PA (US)

(73) Assignee: LumenZ, Inc., Boston, MA (US)

( * ) Notice: Subject to any disclaimer, the term of this patent is extended or adjusted under 35 U.S.C. 154(b) by 0 days.

(21) Appl. No.: 12/755,499

(22) Filed: Apr. 7, 2010

(51) Int. Cl.
*H01L 21/00* (2006.01)
(52) U.S. Cl. ..................................... 438/104
(58) Field of Classification Search ............... 438/104
See application file for complete search history.

(56) References Cited

U.S. PATENT DOCUMENTS

| | | |
|---|---|---|
| 4,272,754 A | 6/1981 | Lou |
| 4,358,950 A | 11/1982 | Chang |
| 4,358,951 A | 11/1982 | Chang |
| 4,568,397 A | 2/1986 | Hoke et al. |
| 4,612,411 A | 9/1986 | Wieting et al. |
| 4,876,984 A | 10/1989 | Kinoshita et al. |
| 4,881,979 A | 11/1989 | Lewis |
| 5,141,564 A | 8/1992 | Chen et al. |
| 5,157,136 A | 10/1992 | Arnold et al. |
| 5,369,290 A | 11/1994 | Kawasaki et al. |
| 5,393,444 A | 2/1995 | Asai |
| 5,413,959 A | 5/1995 | Yamamoto et al. |
| 5,458,085 A | 10/1995 | Kondo et al. |

(Continued)

FOREIGN PATENT DOCUMENTS

JP 2004-214405 7/2004

(Continued)

OTHER PUBLICATIONS

Amano et al. "Metalorganic vapor phase epitaxial growth of a high quality GaN film using an AlN buffer layer" *Appl. Phys. Lett.* 48(5):3535-355 (1986).

(Continued)

*Primary Examiner*—Bradley K Smith
(74) *Attorney, Agent, or Firm*—Myers Bigel Sibley & Sajovec

(57) ABSTRACT

A p-type ZnO-based II-VI compound semiconductor layer has silver, potassium and/or gold dopants therein at a net p-type dopant concentration of greater than about $1 \times 10^{17}$ cm$^{-3}$. A method of forming the layer includes using an atomic layer deposition (ALD) technique. This technique includes exposing a substrate to a combination of gases: a first reaction gas containing zinc at a concentration that is repeatedly transitioned between at least two concentration levels during a processing time interval, a second reaction gas containing oxygen and a p-type dopant gas containing at least one p-type dopant species selected from a group consisting of silver, potassium and gold. A concentration of oxygen in the second reaction gas may also be repeatedly transitioned between at least two concentration levels. The concentration of zinc in the first reaction gas and the concentration of oxygen in the second reaction gas may be transitioned in an alternating sequence, so that relatively high zinc concentrations in the first reaction gas overlap with relatively low oxygen concentrations in the second reaction gas and vice versa.

11 Claims, 4 Drawing Sheets

U.S. PATENT DOCUMENTS

| | | |
|---|---|---|
| 5,468,678 A | 11/1995 | Nakamura et al. |
| 5,545,443 A | 8/1996 | Yamada |
| 5,574,296 A | 11/1996 | Park et al. |
| 5,603,778 A | 2/1997 | Sonoda |
| 5,668,395 A | 9/1997 | Razeghi |
| 5,769,963 A | 6/1998 | Fujioka et al. |
| 5,804,466 A | 9/1998 | Arao et al. |
| 5,863,326 A | 1/1999 | Nause et al. |
| 5,882,805 A | 3/1999 | Higa et al. |
| 5,897,332 A | 4/1999 | Hori et al. |
| 5,900,060 A | 5/1999 | Nause et al. |
| 6,045,626 A | 4/2000 | Yano et al. |
| 6,057,561 A | 5/2000 | Kawasaki et al. |
| 6,147,747 A | 11/2000 | Kavaya et al. |
| 6,181,723 B1 | 1/2001 | Okubo et al. |
| 6,261,862 B1 | 7/2001 | Hori et al. |
| 6,291,085 B1 | 9/2001 | White et al. |
| 6,329,216 B1 | 12/2001 | Matsumoto et al. |
| 6,342,313 B1 | 1/2002 | White et al. |
| 6,407,405 B1 | 6/2002 | Sano et al. |
| 6,410,162 B1 | 6/2002 | White et al. |
| 6,472,241 B2 | 10/2002 | Iwata et al. |
| 6,475,825 B2 | 11/2002 | White et al. |
| 6,479,801 B1 | 11/2002 | Shigeoka et al. |
| 6,491,884 B1 | 12/2002 | Faller et al. |
| 6,506,994 B2 | 1/2003 | Wang et al. |
| 6,509,555 B1 | 1/2003 | Riess et al. |
| 6,521,550 B2 | 2/2003 | Tanabe et al. |
| 6,524,428 B2 | 2/2003 | Tamura et al. |
| 6,527,858 B1 | 3/2003 | Yoshida et al. |
| 6,528,431 B2 | 3/2003 | Tanabe et al. |
| 6,531,408 B2 | 3/2003 | Iwata et al. |
| 6,559,736 B2 | 5/2003 | Lu et al. |
| 6,606,333 B2 | 8/2003 | Kadota |
| 6,620,709 B2 | 9/2003 | Kapolnek et al. |
| 6,621,192 B2 | 9/2003 | Lu et al. |
| 6,624,441 B2 | 9/2003 | Cantwell et al. |
| 6,673,478 B2 | 1/2004 | Kato et al. |
| 6,733,895 B2 | 5/2004 | Kadota et al. |
| 6,815,736 B2 | 11/2004 | Mascarenhas |
| 6,841,000 B2 | 1/2005 | McCandish |
| 6,852,623 B2 | 2/2005 | Park et al. |
| 6,876,009 B2 | 4/2005 | Narukawa et al. |
| 6,887,736 B2 | 5/2005 | Nause et al. |
| 6,896,731 B1 | 5/2005 | Yamamoto et al. |
| 6,908,782 B2 | 6/2005 | Yan et al. |
| 6,936,101 B2 | 8/2005 | Nause et al. |
| 7,105,868 B2 | 9/2006 | Nause et al. |
| 7,122,827 B2 | 10/2006 | Alizadeh et al. |
| 7,132,691 B1 | 11/2006 | Tanabe et al. |
| 7,176,054 B2 | 2/2007 | Nause et al. |
| 2002/0028571 A1 | 3/2002 | Cheung |
| 2003/0011047 A1 | 1/2003 | Cunningham et al. |
| 2003/0064541 A1 | 4/2003 | Kadota et al. |
| 2004/0094085 A1* | 5/2004 | White et al. ............ 117/4 |
| 2005/0012107 A1 | 1/2005 | Shei et al. |
| 2005/0020035 A1 | 1/2005 | Nause et al. |
| 2005/0170971 A1 | 8/2005 | Yata et al. |
| 2005/0285138 A1 | 12/2005 | Burgener, II et al. |
| 2006/0124051 A1 | 6/2006 | Yoshioka et al. |
| 2006/0124943 A1 | 6/2006 | Li et al. |
| 2006/0131599 A1 | 6/2006 | Slater, Jr. et al. |
| 2006/0233969 A1 | 10/2006 | White et al. |
| 2007/0006802 A1 | 1/2007 | Nause et al. |
| 2007/0111372 A1 | 5/2007 | Nause et al. |
| 2007/0126021 A1 | 6/2007 | Ryu et al. |
| 2007/0218703 A1 | 9/2007 | Kaeding et al. |
| 2010/0032008 A1* | 2/2010 | Adekore ............ 136/255 |

FOREIGN PATENT DOCUMENTS

| | | |
|---|---|---|
| JP | 2004-349584 | 12/2004 |
| WO | WO 2006/119927 A1 | 11/2006 |
| WO | WO 2007/034864 A1 | 3/2007 |
| WO | WO 2008/073469 A1 | 6/2008 |

OTHER PUBLICATIONS

Goodings et al. "A New Inlet Area Design for Horizontal MOVPE Reactors" *Journal of Crystal Growth* 96:13-18 (1989).

Gorla et al. "Structural, optical, and surface acoustic wave properties of epitaxial ZnO films grown on (0112) sapphire by metalorganic chemical vapor deposition" *Journal of Applied Physics* 85(5):2595-2602 (1999).

Haga et al. "Group III impurity doped ZnO films prepared by atmospheric pressure chemical-vapor deposition using zinc acetylacetonate and oxygen" *Applied Surface Science* 169-170:504-507 (2001).

Hashimoto et al. Effects of Hydrogen in an Ambient on the Crystal Growth of GaN Using $Ga(CH_3)_3$ and $NH_3$ *Journal of Crystal Growth* 68:163-168 (1984).

Hiramatsu et al. "Transparent conducting ZnO thin films prepared by XeCl excimer laser ablation" *J. Vac. Sci. Technol. A* 16(2):669-673 (1998).

Hu et al. "Atmospheric pressure chemical vapor deposition of gallium doped zinc oxide thin films from diethyl zinc, water, and triethyl gallium" *J. Appl. Phys.* 72(11):5381-5392 (1992).

Kim et al. "Epitaxial growth of Al-doped ZnO thin films grown by pulsed laser deposition" *Thin Solid Films* 420-421:107-111 (2002.

Li et al. "Transparent and conductive Ga-doped ZnO films grown by low pressure metal organic chemical vapor deposition" *J. Vac. Sci. Technol. A* 15(3):1063-1068 (1997).

Liu et al. "Ultraviolet Detectors Based on Epitaxial ZnO Films Grown by MOCVD" *Journal of Electronic Materials* 29(1):69-74 (2000).

Lorenz et al. "Optical and electrical properties of epitaxial $(Mg,Cd)xZn_{1-x}O$, ZnO), and $ZnO1-xGa,Al$) thin films on c-plane sapphire grown by pulsed laser deposition" *Solid-State Electyronics* 47:2205-2209 (2003).

Minegishi et al. "Growth of p-type Zinc Oxide Films by Chemical Vapor Deposition" *Jpn. J. Appl. Phys.* 36:L 1453-L 1455 (1997).

Ohashi et al. "Band-edge emission of undoped and doped ZnO single crystals at room temperature" *Journal of Applied Physics* 91(6):3658-3663 (2002).

Ryu et al. "Fabrication of homostructural ZnO p-n junctions" *Journal of Crystal Growth* 219:419-422 (2000).

Tompa et al. "Metal Organic Chemical Vapor Depositions of Oxide Films for Advanced Applications" *Transparent Conductive Oxides* 1-12 (2000).

Tsurumi et al. "Electric Properties of Zinc Oxide Epitaxial Films Grown by Ion-Beam Sputtering with Oxygen-Radical Irradiation" *Jpn. J. Appl. Phys.* 38:3682-3688 (1999).

Wang et al. "Nitrogen doped ZnO film grown by the plasma-assisted metal-organic chemical vapor deposition" *Journal of Crystal Growth* 226:123-129 (2001).

Woelk et al. "A Novel NOVPE Reactor with a Rotating substrate" *Journal of Crystal Growth* 93:216-219 (1988).

Yamamoto et al "Solution Using a Codoping Method to *Unipolarity* for the Fabrication of *p*-Type ZnO" *Jpn. J. Appl. Phys.* 38:L166-L169 (1999).

Zembutsu et al. "Growth of GaN single crystal films using electron cyclotron resonance plasma excited metalorganic vapor phase epitaxy" *Appl. Phys. Lett.* 48(13)871-872 (1986).

Kanai et al., "Admittance Spectroscopy of ZnO Crystals Containing Ag," Japanese Journal of Applied Physics, vol. 30, No. 9A, Sep. 1991, pp. 2021-2022.

Lee et al., "Effect of Ag photodoping on deep-level emission spectra of ZnO epitaxial films," Applied Physics Letters, vol. 82, No. 4, Jan. 27, 2003, pp. 523-525.

Rita et al., "Lattice site and stability of implanted Ag in ZnO," Physica B 340-342 (2003), pp. 240-244.

Samoilenkov et al., "Low-Temperature MOCVD of Conducting, Micrometer-Thick, Silver Films," Chemical Vapor Deposition, vol. 8, 2002, pp. 74-78.

Tuzemen et al., "Principal Issues in Producing New Ultraviolet Light Emitters Based on Transparent Semiconductor Zinc Oxide," Optical Materials, Elsevier Science Publishers B.V. Amsterdam, NL, vol. 30, No. 2, Sep. 14, 2007, pp. 292-310.

Kurtz et al., "Chemical Vapor Deposition of Titanium Nitride at Low Temperatures," Thin Solid Films, Elsevier-Sequoia S.A. Lausanne, CH, vol. 140, No. 2, Jul. 1, 1986, pp. 277-290.

Jeffries et al., "Crystal Structure of [CF3CF=C(CF3)Ag]4 and its Use as a Chemical Vapor Deposition Precursor for Silver Films," Journal of Organometallic Chemistry, vol. 449, 1993, pp. 203-209.

Özgür Ü et al., "A Comprehensive Review of ZnO Materials and Devices," Journal of Applied Physics, American Institute of Physics, New York, US, vol. 98, No. 4, Aug. 30, 2005, 41301.

Ahn et al., "Synthesis and analysis of Ag-doped ZnO," Journal of Applied Physics 100, 093701 (2006).

Duan et al., "Influence of post-annealing conditions on properties of ZnO:Ag films," Solid State Communications 145 (2008) 479-481.

Fan et al., "The roles played by Ag and Al dopants in controlling the electrical properties of ZnO varistors," J. Appl. Phys. 77 (9) May 1, 1995.

Georgobiani et al., "Luminescence of ZnO Films Implanted with $Au^+$ Ions and Annealed in Oxygen Radicals," Bulletin of the Lebedev Physics Institute, vol. 34, No. 6, 2007, 159-163.

Jeong et al., "Effect of Deposition and Annealing Temperature on Structural, Electrical and Optical Properties of Ag Doped ZnO Thin Films," Kor. J. Mater. Res. vol. 18, No. 2 (2008) pp. 84-91.

Jeong et al., "Physical properties and etching characteristics of metal (Al, Ag, Li) doped AnO films grown by RF magnetron sputtering," Thin Solid Films 516 (2008) 6598-6603.

Jeong et al., "Structural and optical properties of silver-doped zinc oxide sputtered films," Surface & Coatings Technology 193 (2005) 340-344.

Jun et al., "Deposition of K-doped p type ZnO thin films on (0001) $Al_2O_3$ substrates," Materials Letters 62 (2008) 1899-1901.

Kang et al., "Structural, electrical, and optical properties of p-type ZnO thin films with Ag dopant," Applied Physics Letters 88, 202108 (2006).

Kim et al., "Characterization of Ag doped *p*-type ZnO films," Zinc Oxide Materials and Devices II, Proc. of SPIE vol. 6474, 647409, (2007).

Kim et al, "Investigation of p-type behavior in Ag-doped ZnO thin films by E-beam evaporation," Applied Surface Science 255 (2009) 4011-4014.

Kim et al., "The structural and optical behaviors of K-doped ZnO/$Al_2O_3$(0001) films," Applied Physics Letters, vol. 85, No. 3, Jul. 19, 2004.

Look et al., "P-type doping and devices based on ZnO," Phys. Stat. Sol. (b) 241, No. 3, 624-630 (2004).

Park et al., "Origin of p-type doping difficulty in ZnO: The impurity perspective," Physical Review B 66, 073202 (2002).

Pierce et al., "Growth of dense ZnO films via MOVPE on GaN(0001) epilayers using a low/high-temperature sequence," Journal of Crystal Growth 277 (2005) pp. 345-351.

Pierce et al., "Homoepitaxial growth of dense ZnO(0001) and ZnO (1120) films via MOVPE on selected ZnO substrates," Journal of Crystal Growth 283 (2005) pp. 147-155.

Pierce, Jonathan Mark, Master's Thesis, "Growth and Characterization of Epitaxial ZnO Thin Films on GaN(0001) Epilayers and ZnO{0001} Substrates Using Metalorganic Chemical Vapor Deposition," Catalogued on Public Database on Jul. 6, 2005, 62 pages.

Shen et al., "The preparation of ZnO based gas-sensing thin films by ink-jet printing method," Thin Solid Films 483 (2005) 382-387.

Shin et al., "Effect of doping elements on ZnO etching characteristics with $CH_4/H_2/Ar$ plasma," Thin Solid Films 515 (2007) 4950-4954.

Wang et al., "Luminescence and Raman scattering properties of Ag-doped ZnO films," J. Phys D.: Appl. Phys. 39 (2006) 4992-4996.

Xu et al., "Effect of K-doping on structural and optical properties of ZnO thin films," Superlattices and Microstructures 44 (2008) 276-281.

Yan et al., "Doping of ZnO by group-IB elements," Applied Physics Letters 89, 181912 (2006).

Zhang et al., "Effects of Ag Doping on the Photoluminescence of ZnO Films Grown on Si Substrates," J. Phys. Chem. B 2005, 109, 19200-19203.

Zhang et al., "Intrinsic n-type versus p-type doping asymmetry and the defect physics of ZnO," Physical Review B, vol. 63 (2001) 075205.

Zunger, Alex, "Practical doping principles," Appied Physics Letters, vol. 83, No. 1, Jul. 7, 2003, pp. 57-59.

Adekore, Bunmi T., Dissertation entitled "Acceptor Conductivity in Bulk (0001)ZnO," May 5, 2005, 182 pages.

\* cited by examiner

METHODS OF FORMING ZINC OXIDE BASED II-VI COMPOUND SEMICONDUCTOR LAYERS WITH SHALLOW ACCEPTOR CONDUCTIVITIES

REFERENCE TO PRIORITY APPLICATIONS

This application claims priority to U.S. application Ser. No. 11/551,058, filed Oct. 19, 2006, which claims priority to U.S. Provisional Application Ser. No. 60/728,352, filed Oct. 19, 2005, the disclosures of which are hereby incorporated herein by reference.

FIELD OF THE INVENTION

The present invention relates to semiconductor devices and methods of forming same and, more particularly, to compound semiconductor devices and methods of forming same.

BACKGROUND OF THE INVENTION

Zinc oxide (ZnO) materials typically have characteristics that are attractive for use in (i) optoelectronic semiconductor devices, which require emission or detection of electromagnetic radiation, (ii) high frequency and transparent transistors and (iii) radiation hardened devices, for example. However, the use of zinc oxide technologies has frequently been limited by a relative difficulty in reliably fabricating p-type zinc oxide materials with sufficiently high concentrations of relatively shallow acceptor impurities operating as p-type dopants.

Several attempts have been made to fabricate p-type zinc oxide materials using nitrogen (N) as a p-type dopant. Some of these attempts are disclosed in U.S. Patent Publication No. 2005/0170971 to Yata et al., entitled "P-type Zinc Oxide Semiconductor Film and Process for Preparation Thereof," and U.S. Pat. No. 6,908,782 to Yan et al., entitled "High Carrier Concentration P-type Transparent Conducting Oxide Films." Unfortunately, these attempts may result in zinc oxide films having only a relatively small percentage of activated p-type dopants at sufficiently shallow levels. Moreover, nitrogen may only have a limited solid solubility within zinc oxide, which operates as a limit on nitrogen activation and a limit on achieving uniform p-type dopant concentrations throughout a zinc oxide film.

Still further attempts have been made to incorporate phosphorus (P) and arsenic (As) as p-type dopants within zinc oxide films. Some of these attempts are disclosed in U.S. Patent Publication No. 2005/0285138 to Burgener et al., entitled "Persistent P-type Group II-VI Semiconductors," and U.S. Pat. No. 6,291,085 to White et al., entitled "Zinc Oxide Films Containing P-type Dopant and Process for Preparing Same." However, arsenic and phosphorus typically have poor acceptor ionization within zinc oxide, which may result from relatively high degrees of lattice relaxation at oxygen lattice sites. This relative high degree of relaxation typically causes these dopants to act as deep acceptors rather than shallow acceptors. Moreover, because acceptor conductivity within arsenic and/or phosphorus-doped zinc oxide devices may occur as a result of electrical coupling between these dopants and native point defects, which have concentrations that are highly dependent on temperature and variations in process conditions, these devices may be thermally unstable and have characteristics that cannot be reliably reproduced. To address these problems, post-growth annealing/activation steps have been considered to improve the electrical characteristics of the zinc oxide films. Such steps are disclosed in U.S. Pat. No. 6,852,623 to Park et al., entitled "Method for Manufacturing Zinc Oxide Semiconductors."

Zinc oxide films can be fabricated using conventional vapor phase epitaxy (VPE) techniques, which include molecular beam epitaxy (MBE) and metal organic vapor phase epitaxy (MOVPE), and chemical vapor deposition (CVD) techniques. As disclosed in U.S. Pat. No. 6,887,736 and U.S. Patent Publication No. 2005/0020035 to Nause et al., incorporation of acceptor dopants such as arsenic, phosphorous and nitrogen can also occur in-situ. Unfortunately, because arsenic, phosphorous and nitrogen have relatively limited thermodynamic solubility in zinc oxide, only relatively low levels of electrically active acceptor impurities can typically be obtained. Furthermore, not all elements from Groups IA, IB, VA and VB of the periodic table of the elements ionize as shallow acceptors in zinc oxide. For example, some Group IA elements such as sodium and cesium appear to ionize as donors, while other Group IA elements such as rubidium and francium do not appear to contribute electromigratable charge carriers. In addition, copper, which is a Group IB element, appears to ionize isoelectronically as a deep acceptor with localized holes that may not electromigrate or drift in the presence of an electric field as required in practical semiconductor devices. It also appears that possibly all Group VB elements, including vanadium, niobium and tantalum ionize as donors as well.

Zinc oxide films fabricated using conventional processing techniques, such as molecular beam epitaxy (MBE), vapor phase epitaxy (VPE) and metal organic vapor phase epitaxy (MOVPE) may also include crystals that are oxygen deficient resulting from the relatively low partial pressure of oxygen during fabrication. As will be understood by those skilled in the art, this oxygen deficiency may result in the compensation of introduced acceptor ions and thereby limit the concentration of p-type dopant species that contribute to conduction. Conventional MOVPE processing of zinc oxide may also be severely influenced by a relatively high degree of reactivity between oxygen and zinc atoms. This high degree of reactivity may result in the deposition of three dimensional crystals as opposed to more desirable two-dimensional crystals having characteristics that are more compatible with microelectronic devices. Accordingly, conventional MOVPE processing techniques may result in the fabrication of zinc oxide films having a high level of lattice dislocations and grain boundaries that impede device performance by operating as gettering cites for acceptors.

Additional attempts to achieve acceptor conductivities in zinc oxide also include co-doping with lithium ions to achieve highly compensated substrates and then introducing acceptor impurities as described in the aforementioned Yata et al. application, or co-doping with gallium and nitrogen impurities as described in U.S. Pat. No. 6,733,895 to Kadota et al. However, co-doping may be unsuitable for semiconductor fabrication processes because different diffusion mechanisms may exist for each acceptor impurity on the zinc and/or oxygen sublattice, which can lead to thermal instability of at least one of the impurities. For example, in the case of lithium introduced as a compensating impurity in p-type zinc oxide realized through the incorporation of nitrogen, the solubility of nitrogen is reduced as the concentration of lithium increases. This variation in solubility can lead to the dominance of lithium, which is a deep acceptor, on the electrical characteristics of the zinc oxide.

SUMMARY OF THE INVENTION

Methods of forming p-type ZnO-based II-VI compound semiconductor layers according to embodiments of the present invention include processing techniques that enable incorporation of sufficient quantities of activated silver, potassium and/or gold dopants into a zinc sublattice within a ZnO-based II-VI compound semiconductor layer. These techniques use processing conditions that yield a net p-type dopant concentration of greater than about $1\times10^{17}$ cm$^{-3}$ therein, for dopants having an acceptor ionization energy below about 355 meV. The processing conditions may also yield a dopant activation level of greater than about 10% for the dopants having the desired acceptor ionization energy. The p-type ZnO-based II-VI compound semiconductor layer may be a layer selected from a group consisting of ZnO, ZnMgO, ZnCaO, ZnBeO, ZnSrO, ZnBaO, ZnCdO and ZnInO and MgCdZnO layers and composites of these layers.

In some of these embodiments, the process techniques for incorporating p-type dopants may include implanting the silver, potassium and/or gold dopants into the ZnO-based II-VI compound semiconductor layer at dose levels in a range from about $1\times10^{13}$ cm$^{-2}$ to about $1\times10^{15}$ cm$^{-2}$. This implanting step may be performed as a single implanting step or as multiple implanting steps, which are performed at multiple different implant energy levels to thereby yield multiple implant peaks within the layer. An annealing step is then performed to more evenly distribute and activate the dopants and repair crystal damage within the layer. This annealing step may include annealing the ZnO-based II-VI compound semiconductor layer at a temperature in a range from about 250° C. to about 2000° C., in an ambient (e.g., chemically inert ambient) having a pressure in a range from about 25 mbar to about 7 kbar. More preferably, the annealing step may be performed at a temperature in a range from about 700° C. to about 900° C., in an oxygen ambient having a pressure of about 1 atmosphere.

According to additional embodiments of the present invention, the silver, potassium and/or gold dopants are incorporated into a zinc sublattice within a ZnO-based II-VI compound semiconductor layer using an metal organic vapor deposition technique. This technique may include exposing a substrate that is held at a temperature of greater that about 300° C. to a combination of a first reaction gas containing zinc, a second reaction gas containing oxygen and a dopant gas containing silver, potassium and/or gold dopants. This substrate may be selected from a group consisting of zinc oxide, III-nitrides, silicon, sapphire and/or glass.

Still further embodiments of the present invention include forming a ZnO-based II-VI compound semiconductor layer using an atomic layer deposition (ALD) technique. This deposition technique may include exposing a substrate to a combination of gases. This combination may include a first reaction gas containing zinc at a concentration that is repeatedly transitioned (e.g., pulsed) between at least two concentration levels during a processing time interval, a second reaction gas containing oxygen and a p-type dopant gas containing at least one p-type dopant species selected from a group consisting of silver, potassium and gold. According to additional aspects of these embodiments, a concentration of oxygen in the second reaction gas may be repeatedly transitioned (e.g., pulsed) between at least two concentration levels. In particular, a concentration of zinc in the first reaction gas and a concentration of oxygen in the second reaction gas may be transitioned in an alternating sequence, so that relatively high zinc concentrations in the first reaction gas overlap with relatively low oxygen concentrations in the second reaction gas and vice versa.

Moreover, according to still further aspects of these embodiments, a concentration of the at least one p-type dopant species in the p-type dopant gas may be repeatedly transitioned (e.g., pulsed) between at least two dopant concentration levels during the processing time interval. The pulses in the p-type dopant gas concentrations may have durations that are shorter than the pulses in the first reaction gas concentrations and also shorter than the pulses in the second reaction gas concentrations.

Methods of forming a ZnO-based II-VI compound semiconductor layer may also include using an iterative nucleation and growth technique. This technique may include using an alternating sequence of deposition/growth steps that favor c-plane growth (i.e., vertical growth direction, which causes nucleation) at relatively low temperatures interleaved with a-plane growth (i.e., horizontal growth direction, which causes densification) at relatively high temperatures to coalesce the layer. In particular, iterative nucleation and growth may include depositing a plurality of first ZnO-based II-VI compound semiconductor layers at a first temperature in a range from about 200° C. to about 600° C. and depositing a plurality of second ZnO-based II-VI compound semiconductor layers at a second higher temperature in a range from about 400° C. to about 900° C. These first and second ZnO-based II-VI compound semiconductor layers are deposited in an alternating sequence so that a composite layer is formed.

Still further methods of forming a p-type ZnO-based II-VI compound semiconductor layer include exposing the substrate to a combination of a first reaction gas containing zinc, a second reaction gas containing oxygen and a p-type dopant gas containing at least one p-type dopant species selected from a group consisting of silver, potassium and gold, while simultaneously transitioning a temperature of the substrate between at least two temperatures. These at least two temperatures may include a first lower temperature in a range from about 200° C. to about 600° C. and a second higher temperature in a range from about 400° C. to about 900° C. According to aspects of these embodiments, the concentration of the at least one p-type dopant species in the p-type dopant gas is repeatedly transitioned between at least two concentration levels while the temperature of the substrate is also being transitioned between the at least two temperatures. In particular, the concentration of the at least one p-type dopant species in the p-type dopant gas is transitioned in an alternating sequence relative to the transitioning of the temperature of the substrate so that relatively high concentrations of the p-type dopant species in the p-type dopant gas overlap with relatively low temperatures of the substrate and vice versa. Alternatively, the concentration of the at least one p-type dopant species in the p-type dopant gas is transitioned so that relatively high temperatures of the substrate overlap with a timing of relatively high concentrations of the p-type dopant species in the p-type dopant gas.

Methods of forming a p-type ZnO-based II-VI compound semiconductor region may also include incorporating sufficient quantities of silver, potassium and/or gold dopants into a zinc sublattice within the ZnO-based II-VI compound semiconductor region under processing conditions that yield a net p-type dopant concentration of greater than about $1\times10^{17}$ cm$^{-3}$ therein. In particular, a ZnO-based II-VI compound semiconductor layer may be formed on a substrate that is held at a temperature of greater than about 300° C., using a molecular beam epitaxy technique. This substrate may be selected from a group consisting of zinc oxide, III-nitrides, silicon, sapphire and/or glass, however, other substrates may also be used. In some of these embodiments, the molecular beam epitaxy technique may include Knudsen evaporation of a zinc source. Alternatively, the steps of forming a ZnO-based II-VI compound semiconductor layer may include using a chemical vapor transport technique. In this technique, hydride or halide transport of zinc to a substrate may be provided. Still further embodiments may include using a physical vapor transport technique that includes transport of zinc to a substrate by evaporation, magnetron sputtering, flame hydrolysis deposition or sublimation. Liquid phase epitaxy techniques and solvus-thermal incorporation techniques may also be used to form the ZnO-based II-VI compound semiconductor region.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1A:
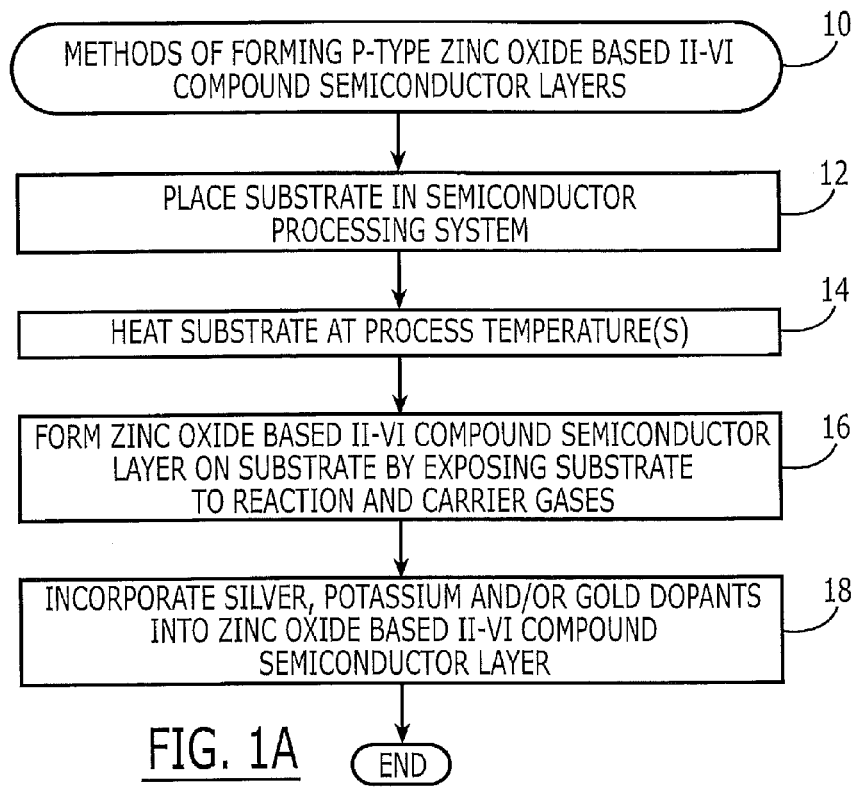
FIG. 1A is a flow diagram that illustrates methods of forming p-type ZnO-based II-VI compound semiconductor layers according to embodiments of the present invention.

Referring now to FIG. 1A, methods 10 of forming p-type ZnO-based II-VI compound semiconductor layers according to embodiments of the present invention may include placing a substrate in a semiconductor processing system (e.g., sealed processing chamber), Block 12, and then heating the substrate to a desired temperature(s), Block 14. This substrate may be selected from a group consisting of zinc oxide based II-VI compound semiconductor substrates, III-nitrides, silicon, sapphire and/or glass, however, other substrates may also be used. Thereafter, as illustrated by Block 16, a zinc oxide based II-VI compound semiconductor layer is formed on the substrate by exposing a primary surface of the substrate to reaction and carrier gases. P-type dopants may be incorporated into the layer in-situ (i.e., while the layer is being formed) or after the layer is formed, Block 18, to thereby yield zinc oxide based II-VI compound semiconductor layers according to embodiments of the present invention.

Some of the methods 10 of forming p-type ZnO-based II-VI compound semiconductor layer include processing techniques that enable incorporation of sufficient quantities of activated silver, potassium and/or gold dopants into a zinc sublattice within a ZnO-based II-VI compound semiconductor layer. These techniques use processing conditions that yield a net p-type dopant concentration of greater than about $1\times10^{17}$ cm$^{-3}$ therein, for dopants having an acceptor ionization energy below about 355 meV. The processing conditions may also yield a dopant activation level of greater than about 10% for the dopants having the desired acceptor ionization energy. Although not wishing to be bound by any theory, it is proposed that silver, potassium and gold impurities represent preferred dopants because they have ionization potentials that are about equal to or greater than the ionization potential of zinc atoms in the zinc sublattice and, therefore, do not cause significant lattice relaxation within the semiconductor layer being formed. These dopants also may be preferred because they can be processed to achieve relatively high levels of activation. This high degree of activation can be achieved, in part, because these dopants form a more covalent relationship with oxygen than the zinc-oxygen bond, which means their electron affinity is greater than the electron affinity of zinc. These dopants are also stable within the zinc sublattice, which means they do not contribute significantly to diffusion by interstitial transport mechanisms. The p-type ZnO-based II-VI compound semiconductor layer may be a layer selected from a group consisting of ZnO, ZnMgO, ZnCaO, ZnBeO, ZnSrO, ZnBaO, ZnCdO and ZnInO and MgCdZnO layers and composites of these layers.

Referring again to Blocks 16 and 18, a p-type zinc oxide based II-VI compound semiconductor layer according to some embodiments of the invention may be initially formed on the substrate by exposing the substrate to reaction and carrier gases. P-type dopants may then be incorporated into the layer after the layer has been formed using ion implantation techniques. These techniques include implanting silver, potassium and/or gold dopants into the ZnO-based II-VI compound semiconductor layer at dose levels in a range from about $1\times10^{13}$ cm$^{-2}$ to about $1\times10^{15}$ cm$^{-2}$. Dose levels significantly greater than about $1\times10^{15}$ cm$^{-2}$ may result in undesirable secondary phases and pronounced gettering of the implanted dopants. This implanting step may be performed as a single implanting step or as multiple implanting steps, which are performed at multiple different implant energy levels to thereby yield multiple implant peaks within the layer.

An annealing step is then performed to more evenly distribute and activate the dopants and repair crystal damage within the implanted layer. This annealing step may include annealing the ZnO-based II-VI compound semiconductor layer at a temperature(s) in a range from about 250° C. to about 2000° C., in an ambient (e.g., chemically inert ambient) having a pressure(s) in a range from about 25 mbar to about 7 kbar. This ambient may include the original reaction and carrier gases, oxygen, ozone, nitrogen, argon, or other chemically inert ambients, for example. More preferably, the annealing step may be performed at a temperature(s) in a range from about 700° C. to about 900° C., in an oxygen ambient having a pressure of about 1 atmosphere.

According to an additional embodiment of the present invention, the steps illustrated by Blocks 16 and 18 may be performed concurrently using an in-situ doping technique. In particular, the silver, potassium and/or gold dopants may be incorporated into a zinc sublattice within a ZnO-based II-VI compound semiconductor layer using an metal organic vapor phase epitaxy (MOVPE) technique. This technique includes transporting concentrations of an organometallic precursor of silver, potassium and/or gold by an inert gas (e.g., argon and/or nitrogen) to a gas stream containing an organometallic precursor of zinc and an oxygen source. This gas stream is directed towards a substrate that is held in an ambient at a growth temperature(s) between about 400° C. and about 1000° C. The pressure of the ambient is held in a range from about 20 Torr to about 76 Torr. This layer formation may be preceded by steps to nucleate ZnO-based II-VI compound semiconductor crystals on the substrate. This nucleation step may be performed for about 15 minutes while the substrate is held at a temperature of about 400° C. These crystals then undergo a densification process at 800° C. for about 15 minutes using an MOVPE technique with diethylzinc and oxygen as source gases. This densification process may be performed at pressures in a range from about 10 Torr to about 40 Torr.

Alternative oxygen source gases, including carbon dioxide, nitrous oxide, and/or nitrogen dioxide may also be used.

Another MOVPE technique includes halide-assisted MOVPE. This technique includes the use of a halide source of silver, potassium and/or gold dopants. These halide sources include silver, potassium and/or gold iodides and chlorides. The dopants are transported by an inert gas to a gas stream containing an organometallic precursor or halide source of zinc and an oxygen source, which is directed towards a substrate that is held in an ambient at a growth temperature(s) between about 400° C. and about 1000° C. The pressure of the ambient is held in a range from about 20 Torr to about 76 Torr. This layer formation may be preceded by steps to nucleate ZnO-based II-VI compound semiconductor crystals on the substrate. This nucleation step may be performed for about 15 minutes while the substrate is held at a temperature of about 400° C. These crystals then undergo a densification process at 800° C. for about 15 minutes using an MOVPE technique with $ZnCl_2$ and oxygen as source gases. This densification process may be performed at pressures in a range from about 10 Torr to about 40 Torr. Alternative oxygen source gases, including carbon dioxide and/or nitrous oxide, may also be used.

An additional MOVPE technique includes hydride-assisted MOVPE. This technique includes the use of a hydride source of silver, potassium or gold dopants. These dopants are transported by an inert gas to a gas stream containing an organometallic precursor or hydride source of zinc and an oxygen source, which is directed towards a substrate that is held in an ambient at a growth temperature(s) between about 400° C. and about 1000° C. The pressure of the ambient is held in a range from about 20 Torr to about 76 Torr. This layer formation may be preceded by steps to nucleate ZnO-based II-VI compound semiconductor crystals on the substrate. This nucleation step may be performed for about 15 minutes while the substrate is held at a temperature of about 400° C. These crystals then undergo a densification process at 800° C. for about 15 minutes using an MOVPE technique with $ZnH_2$ and oxygen as source gases. This densification process may be performed at pressures in a range from about 10 Torr to about 40 Torr. Alternative oxygen source gases, including carbon dioxide and/or nitrous oxide, may also be used.

Additional methods 10 of forming a p-type ZnO-based II-VI compound semiconductor layer may include using a molecular beam epitaxy technique. Using this technique, the source of silver, potassium and/or gold may be evaporated from a first Knudsen cell to a substrate concurrently with the evaporation of Zn from a second Knudsen cell in a partial pressure of oxygen. These steps may be performed at a growth temperature(s) of about 400° C. and a pressure(s) from about 25 mbar to about 700 mbar. Still further methods 10 may include using a physical vapor transport technique that includes transport of zinc to a substrate by evaporation, magnetron sputtering, flame hydrolysis deposition and/or sublimation.

Liquid phase epitaxy techniques and solvus-thermal incorporation techniques may also be used to form the ZnO-based II-VI compound semiconductor region. Moreover, a hydrothermal growth technique may be used that utilizes: (i) supercritical $H_2O$ at between 34 bar and 4 kbar, (ii) a mineralizing agent such as LiOH and/or KOH, (iii) ZnO particles for nutrients, (iv) ZnO or GaN or sapphire templates for growth seeds and (v) an ore of silver, potassium and/or gold impurities. This ore may be obtained as an oxide, carbonate, sulphate, sulphide, halide, hydride and/or borate of these impurities. Preferred growth conditions include establishing dissolution and crystallization zones at 425° C. and 400° C., respectively, in a 5N LiOH/KOH buffer using an inert liner such as silver or platinum and water balancing and oxides of silver, potassium or gold at 28,000 psi or 1.9 kbar. The dopants can be interspersed with the nutrients or separately suspended and other sources of dopants that are miscible with water, such as hydrides, sulphates, borates, phosphates, and.or carbonates, can also be used.

Figure 1B:
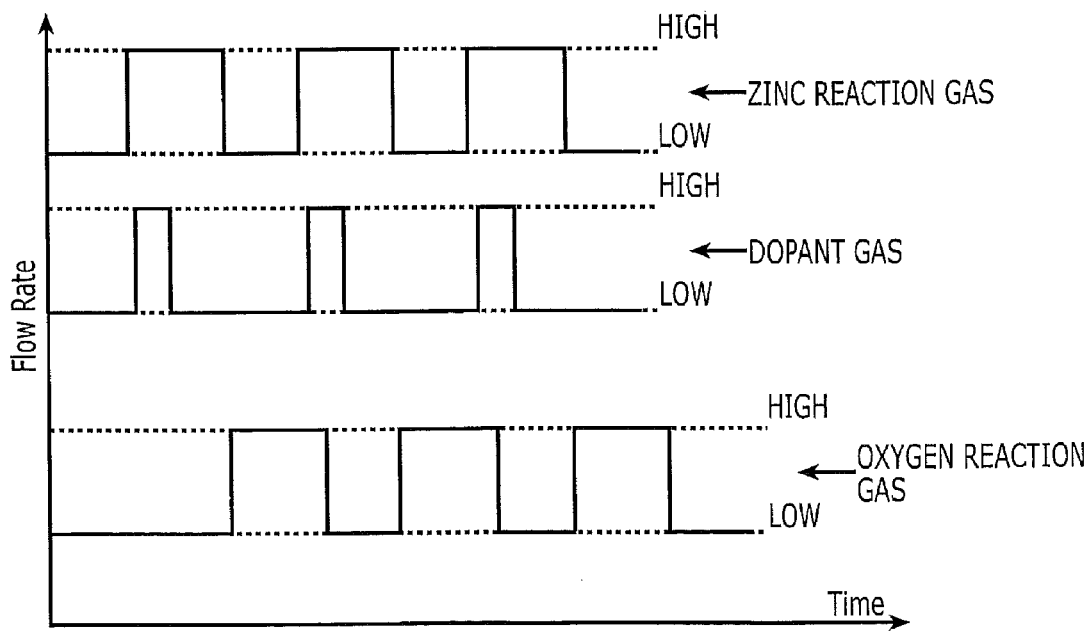
FIGS. 1B-1D are graphs that illustrate flow rate levels of reaction gases used to form compound semiconductor layers according to embodiments of the present invention.

Still further embodiments of the present invention include forming a ZnO-based II-VI compound semiconductor layer using an atomic layer deposition (ALD) technique. This deposition technique may include exposing a substrate to a combination of gases. As illustrated by FIG. 1B, this combination may include: (i) a first reaction gas containing zinc at a concentration that is repeatedly transitioned (e.g., pulsed) between at least two concentration levels (high and low) during a processing time interval, (ii) a second reaction gas containing oxygen at a concentration that is repeatedly transitioned (e.g., pulsed) between at least two concentration levels (high and low), (iii) a p-type dopant gas containing at least one p-type dopant species selected from a group consisting of silver, potassium and gold, and (iv) an inert carrier gas (e.g., argon, nitrogen, . . . ). In some of these embodiments, the low levels may be "off" levels and the high concentrations of the first and second reaction gases may be selected to achieve a Group VI/Group II ratio in a range from 1 to 500,000 and, more preferably, in a range from about 20 to about 200.

As illustrated by FIG. 1B, the concentration of zinc in the first reaction gas and the concentration of oxygen in the second reaction gas may be transitioned in an alternating sequence, so that relatively high zinc concentrations in the first reaction gas overlap with relatively low oxygen concentrations in the second reaction gas and vice versa. Alternatively, as illustrated by FIG. 1D, the concentration of zinc in the first reaction gas and the concentration of oxygen in the second reaction gas may be transitioned so that relatively high zinc concentrations in the first reaction gas overlap with relatively high oxygen concentrations in the second reaction gas. These transitions may be abrupt transitions or relatively gradual transitions.

FIG. 1B also illustrates that a concentration of the at least one p-type dopant species in the p-type dopant gas may be repeatedly transitioned (e.g., pulsed) between at least two dopant concentration levels (high and low) during the processing time interval. These pulses have durations that are shorter than the pulses in the first reaction gas concentrations and also shorter than the pulses in the second reaction gas concentrations. Examples of dopant precursors include silver trifluoroacetate ($Ag(COOCF_3)$) and N,N-di(isopropyl)acetamidnate complexes of silver, for example.

Figure 1C:
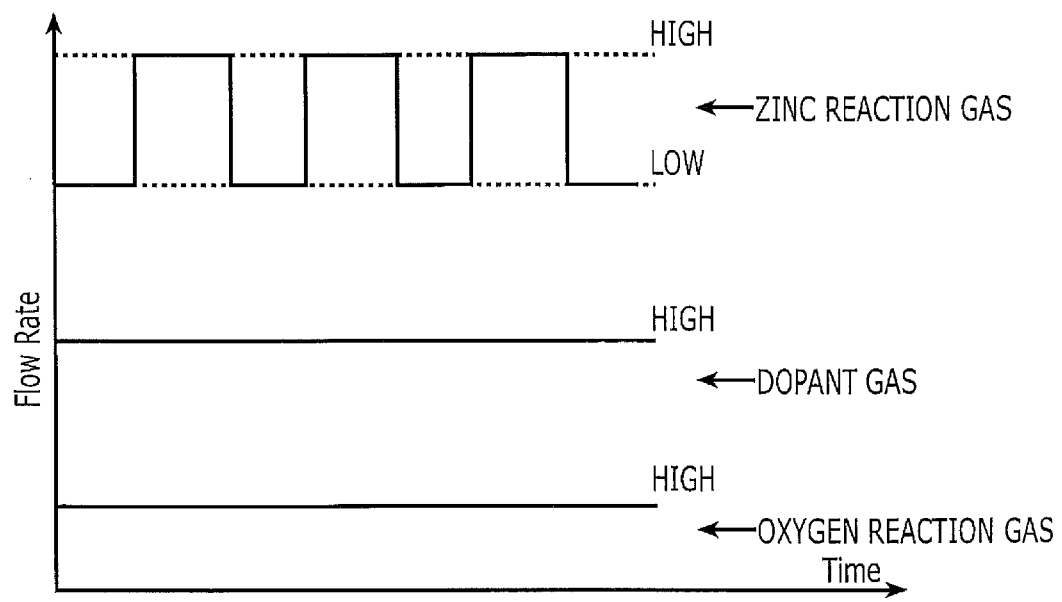
Figure 1D:
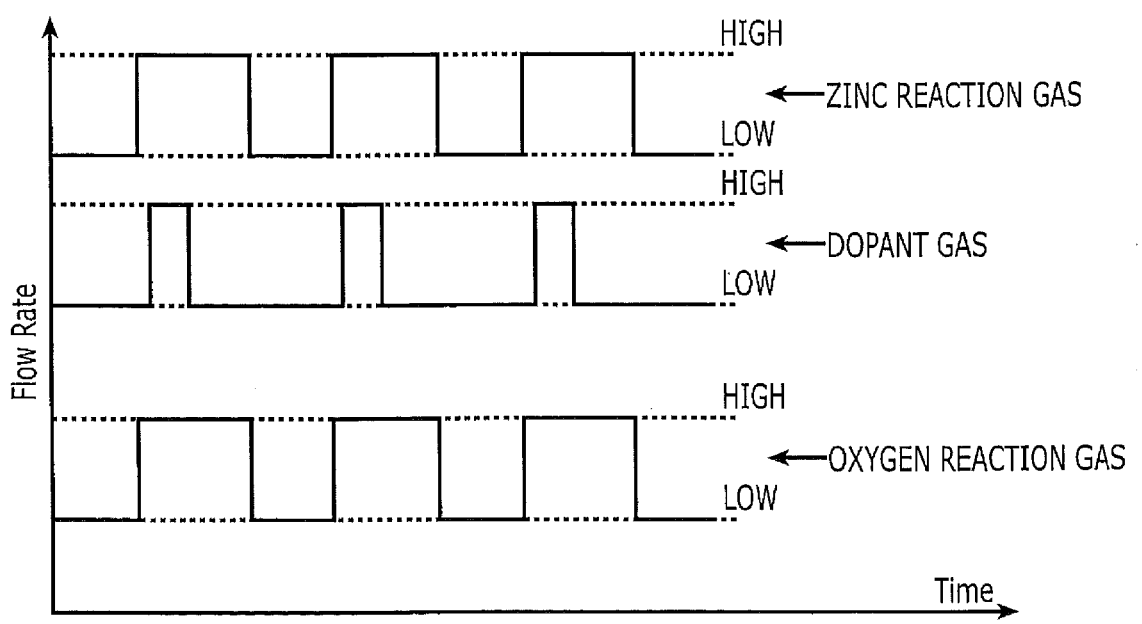

Referring now to FIG. 1C, an alternative ALD deposition technique may include exposing a substrate to: (i) a first reaction gas containing zinc at a concentration that is repeatedly transitioned between at least two concentration levels (high and low) during a processing time interval, (ii) a second reaction gas containing oxygen having a concentration that is held at a constant level, (iii) a p-type dopant gas having a concentration that is held at a constant level, and an inert carrier gas (e.g., argon, nitrogen, . . . ).

Methods of forming a ZnO-based II-VI compound semiconductor layer may also include using an iterative nucleation and growth technique. This technique may include using an alternating sequence of deposition steps. In particular, iterative nucleation and growth may include depositing a plurality of first ZnO-based II-VI compound semiconductor layers at one or more first temperatures in a range from about 200° C. to about 600° C. and depositing a plurality of second ZnO-based II-VI compound semiconductor layers at one or more second higher temperatures in a range from about 400° C. to about 900° C. These first and second ZnO-based II-VI compound semiconductor layers are deposited in an alternating sequence so that a composite layer is formed.

Figure 1E:
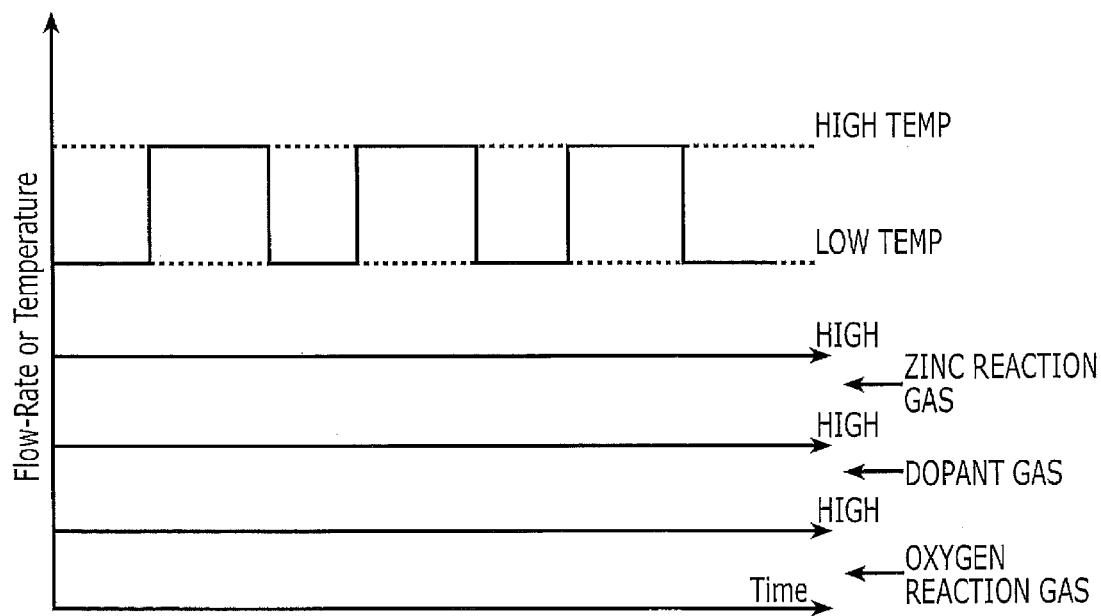
FIGS. 1E-1G are graphs that illustrate temperatures and flow rate levels of reaction gases used to form compound semiconductor layers according to embodiments of the present invention.
Figure 1F:
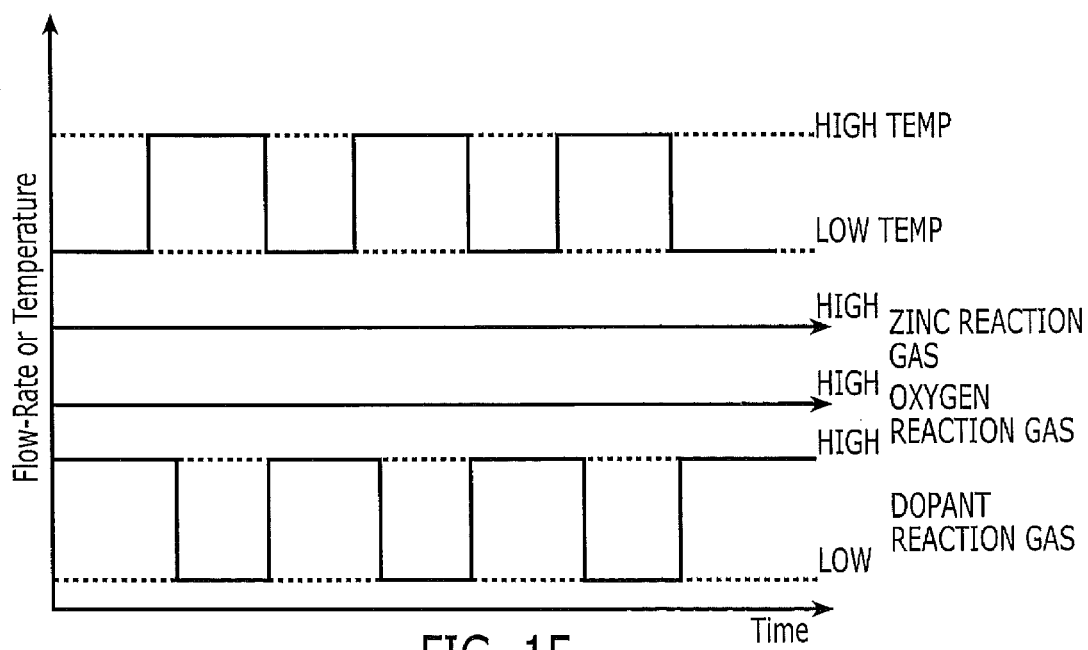
Figure 1G:
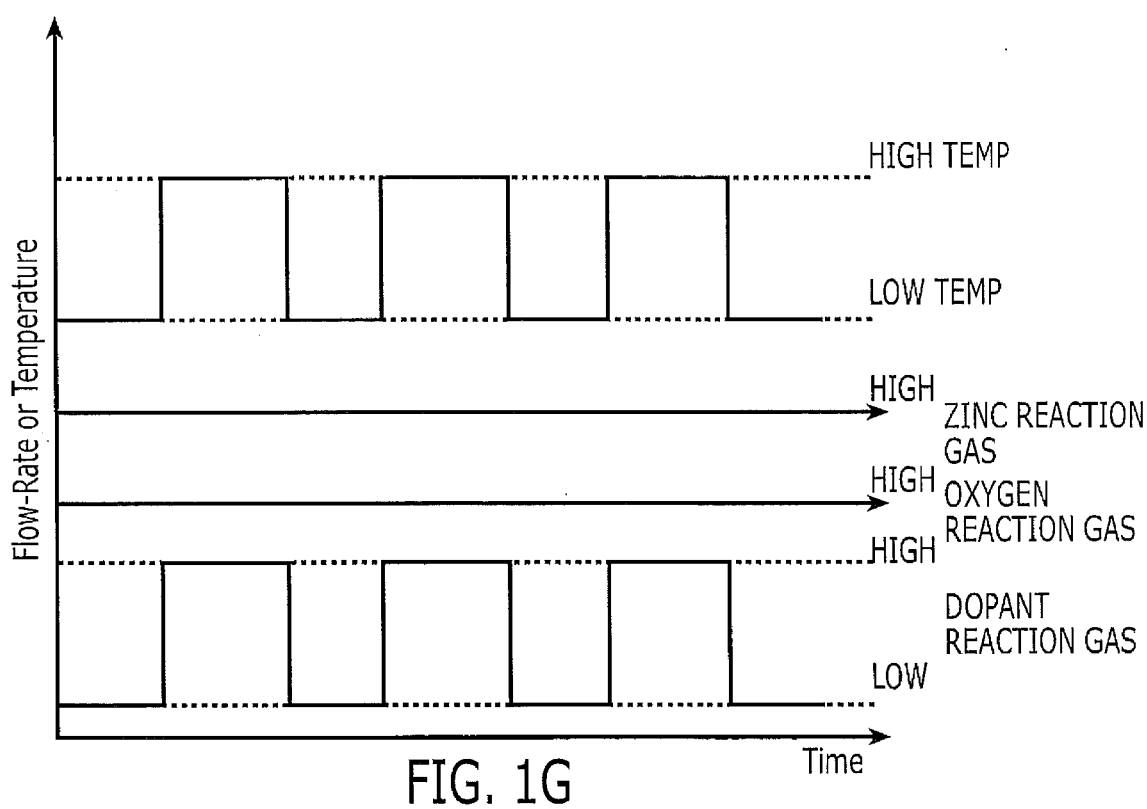

As illustrated by FIGS. 1E-1G, still further methods of forming a p-type ZnO-based II-VI compound semiconductor layer include exposing the substrate to a combination of a first reaction gas containing zinc, a second reaction gas containing oxygen and a p-type dopant gas containing at least one p-type dopant species selected from a group consisting of silver, potassium and gold, while simultaneously transitioning a temperature of the substrate between at least two temperatures ("low" and "high"). These temperature transitions may be abrupt or gradual temperature transitions. In particular, these at least two temperatures may include a first lower temperature(s) in a range from about 200° C. to about 600° C. and a second higher temperature(s) in a range from about 400° C. to about 900° C. According to aspects of these embodiments, the concentration of the at least one p-type dopant species in the p-type dopant gas is repeatedly transitioned between at least two concentration levels while the temperature of the substrate is also being transitioned between the at least two temperatures. In particular, as illustrated by FIG. 1F, the concentration of the at least one p-type dopant species in the p-type dopant gas is transitioned in an alternating sequence relative to the transitioning of the temperature of the substrate so that relatively high concentrations of the p-type dopant species in the p-type dopant gas overlap with relatively low temperatures of the substrate and vice versa. Alternatively, as illustrated by FIG. 1G, the concentration of the at least one p-type dopant species in the p-type dopant gas is transitioned so that relatively high temperatures of the substrate overlap with a timing of relatively high concentrations of the p-type dopant species in the p-type dopant gas.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a p-type ZnO-based II-VI compound semiconductor layer, comprising:
   depositing at least first and second p-type ZnO-based II-VI compound semiconductor layers on a substrate at a first temperature in a first range from about 200° C. to about 600° C. and at a different second temperature in a second range from about 400° C. to about 900° C., respectively.

2. The method of claim 1, wherein said depositing comprises depositing the second p-type ZnO-based II-VI compound semiconductor layer on the first p-type ZnO-based II-VI compound semiconductor layer or vice versa.

3. The method of claim 2, wherein said depositing comprises exposing the substrate to a combination of a first reaction gas containing zinc, a second reaction gas containing oxygen and a p-type dopant gas containing at least one p-type dopant species selected from a group consisting of silver, potassium and gold.

4. The method of claim 3, wherein a concentration of the at least one p-type dopant species in the p-type dopant gas is repeatedly transitioned between at least two different concentration levels while a temperature of the substrate is being transitioned between at least two different temperatures.

5. The method of claim 3, wherein a concentration of the at least one p-type dopant species in the p-type dopant gas is repeatedly transitioned between at least two different concentration levels while a temperature of the substrate is being transitioned between the first and second different temperatures.

6. A method of forming a p-type ZnO-based II-VI compound semiconductor layer, comprising:
   providing a substrate; and
   depositing a p-type ZnO-based II-VI compound semiconductor layer on the substrate using vapor phase epitaxy,
   wherein the p-type ZnO-based II-VI compound semiconductor layer includes at least one p-type dopant species selected from a group consisting of silver, potassium and gold, and
   wherein depositing the p-type ZnO-based II-VI compound semiconductor layer includes nucleating ZnO-based II-VI compound semiconductor crystals on the substrate.

7. The method of claim 6, wherein depositing the p-type ZnO-based II-VI compound semiconductor layer is performed using metal organic vapor phase epitaxy.

8. The method of claim 6, further comprising densifying the p-type ZnO-based II-VI compound crystals.

9. The method of claim 6, wherein the at least one p-type dopant species is incorporated in-situ during vapor phase epitaxy.

10. The method of claim 6, wherein nucleating the ZnO-based II-VI compound semiconductor crystals is performed at a temperature of about 400° C.

11. A method of forming a ZnO-based II-VI compound semiconductor layer, comprising:
   depositing at least first and second ZnO-based II-VI compound semiconductor layers on a substrate at a first temperature in a first range from about 200° C. to about 600° C. and at a different second temperature in a second range from about 400° C. to about 900° C., respectively, said at least first and second ZnO-based II-VI compound semiconductor layers including at least one p-type ZnO-based II-VI compound semiconductor layer.

* * * * *